United States Patent
Muth

(10) Patent No.: US 6,628,490 B2
(45) Date of Patent: Sep. 30, 2003

(54) CIRCUIT ARRANGEMENT

(75) Inventor: Michael Muth, Stelle (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 24 days.

(21) Appl. No.: 09/922,143

(22) Filed: Aug. 3, 2001

(65) Prior Publication Data

US 2002/0067583 A1 Jun. 6, 2002

(30) Foreign Application Priority Data

Aug. 5, 2000 (DE) .......................... 100 38 323

(51) Int. Cl.⁷ .............................. H02H 3/20; H02H 9/04
(52) U.S. Cl. ......................... 361/91.1; 361/56
(58) Field of Search .................... 361/91.1, 56, 111, 361/88

(56) References Cited

U.S. PATENT DOCUMENTS

| | | | |
|---|---|---|---|
| 4,254,442 A | | 3/1981 | Dijkmans et al. .............. 361/56 |
| 4,270,206 A | * | 5/1981 | Hughes .......................... 375/9 |
| 4,777,645 A | * | 10/1988 | Faith et al. ..................... 379/31 |
| 5,027,250 A | * | 6/1991 | Cini et al. ...................... 361/90 |
| 5,046,060 A | * | 9/1991 | Chow et al. ................. 369/44.32 |
| 5,198,957 A | * | 3/1993 | Welty et al. .................... 361/18 |
| 5,774,318 A | * | 6/1998 | McClure et al. .............. 361/56 |

FOREIGN PATENT DOCUMENTS

| | | | |
|---|---|---|---|
| DE | 3828434 A1 | 1/1990 | ......... H01H/43/00 |
| EP | 0360933 A1 | 4/1990 | |

OTHER PUBLICATIONS

Patent Abstracts Of Japan, Termoto Shigeki, "Input Protection Diode," Publication No. 10294383, Nov. 4, 1998, Application No. 09104311, Apr. 22, 1997.
Patent Abstracts Of Japan, Hirakata Hobuyuki, "Input/Output Protection Circuit For semiconductor Device," Publication No. 06178445, Jun. 24, 1994, Application No. 04331813, Dec. 11, 1992.

* cited by examiner

*Primary Examiner*—Gregory J. Toatley, Jr.
*Assistant Examiner*—Z Kitov
(74) *Attorney, Agent, or Firm*—Aaron Wagner

(57) ABSTRACT

To provide a circuit arrangement for protecting the input of an integrated circuit particularly suitable for analog signals, more specifically a CMOS circuit, against overvoltages, said circuit arrangement (100) comprising:

Figure 1:
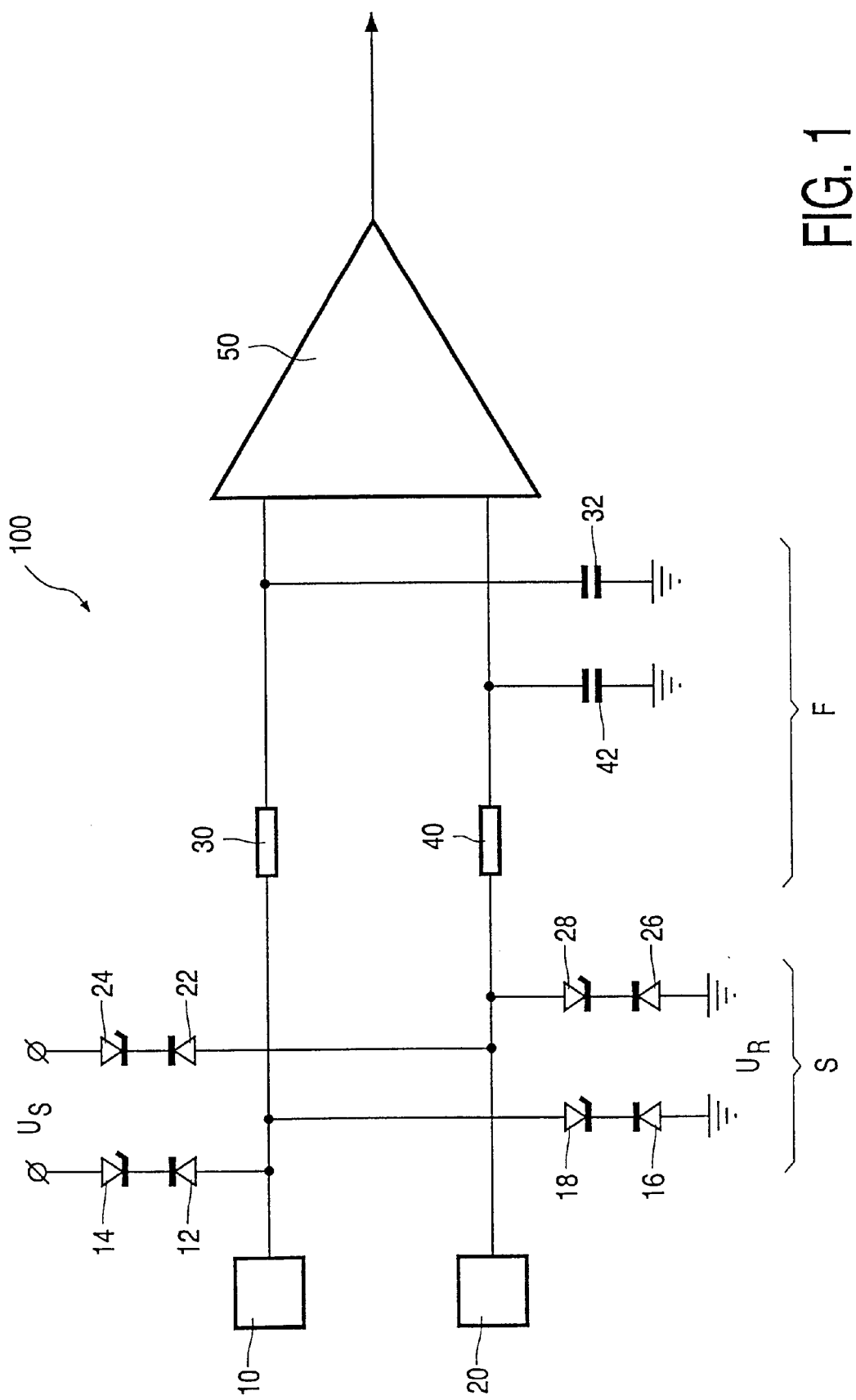

at least two input terminals (10; 20) and at least one protection stage (S) in which each input terminal (10; 20) is connected to a power supply voltage ($U_S$) by a respective protection diode (12; 22), particularly a semiconductor diode, and to a reference potential ($U_R$) by a respective protection diode (16; 26), particularly a semiconductor diode, by which, on the one hand, disturbing demodulation effects affecting the signal path can be reliably avoided in the input signal due to a simple and low-cost structure, and, on the other hand, effective protection of overvoltages caused by electrostatic discharges is ensured, it is proposed that at least a further diode (14, 18; 24; 28) is arranged in series with each protection diode (12, 16; 22, 26), and the protection stage (S) precedes at least a filter stage (F), particularly at least a high-frequency filter stage.

10 Claims, 2 Drawing Sheets

CIRCUIT ARRANGEMENT

The invention relates to a circuit arrangement for protecting the input of an integrated circuit particularly suitable for analog signals, more specifically a CMOS circuit, against overvoltages, said circuit arrangement comprising:

at least two input terminals and at least one protection stage in which each input terminal is connected to a power supply voltage by a respective protection diode, particularly a semiconductor diode, and to a reference potential by a respective protection diode, particularly a semiconductor diode.

Such a circuit arrangement is known from, for example, U.S. Pat. No. 4,254,442. This document discloses a circuit arrangement for protecting telephone connections and electronic circuits connected thereto against overvoltages; a first pair of semiconductor protection diodes is series-arranged in the same direction between two points of constant potential in such a way that the protection diodes are normally blocked, while the junction between the protection diodes is connected to a wire of the telephone connection so that, in the case of occurrence of overvoltages, the voltage of the wire is clamped on the potential of the one or the other point of constant potential. Furthermore, a second pair of semiconductor protection diodes is provided which is series-arranged in the same direction between two points of constant potential in such a way that the protection diodes are normally blocked, while the junction between the protection diodes is connected to the wire of the telephone connection; the wire of the telephone connection includes an impedance, preferably an inductance, between the junction with the first protection diode pair and the junction with the second protection diode pair, while the potential range between the points of constant potential of the second protection diode pair is larger than the potential range between the points of constant potential of the first protection diode pair or corresponds to this potential range.

The known circuit arrangements allow protection from overvoltages as occur, for example, in the bond pads (=electrically conducting contact areas of an integrated circuit, particularly a chip) and may destroy the subsequent integrated circuit (such overvoltages may occur, for example, in the case of ESD (=electrostatic discharge); particularly, the structure of CMOS circuits makes them very sensitive to high input voltages. The protection diodes become conducting when the input voltage decreases below the reference potential or exceeds the power supply voltage so that overvoltages are discharged via the protection diodes, i.e. are short-circuited to a certain extent by the protection diodes.

In other words, this means that the control range for the input voltage is limited to the voltage range between the reference potential and the power supply voltage. Such a limitation of the control range for the input voltage is, however, a problem when external high-frequency disturbances lead to voltage amplitudes at the input terminals which are outside the control range defined by the reference potential and the power supply voltage. In this case, the protection diodes change over to the forward direction, which involves demodulations of the mostly analog input signal; exactly such demodulation effects lead to significant disturbances in the signal path, also in the lower frequency range.

It is an object of the invention to provide a circuit arrangement of the type described in the opening paragraph, in which, on the one hand, disturbing demodulation effects affecting the signal path are reliably avoided in the input signal due to a simple and low-cost structure, and, on the other hand, effective protection against overvoltages caused by electrostatic discharges is ensured.

This object is solved by the characteristic features as defined in claim 1. Advantageous embodiments and essential improvements of the present invention are defined in the dependent claims.

In accordance with the teaching of the present invention, the control range for the input voltage can be increased to a voltage range which is increased by the breakdown voltages of the Z(ener) diodes and is thus larger than the voltage range between the reference potential and the power supply voltage by virtue of the fact that at least a further diode, particularly at least a Z(ener) diode and/or at least a preferably parasitic transistor diode with Z(ener) effect is arranged in series with each protection diode.

The further diodes are to be dimensioned in such a way that the voltage range increased by the breakdown voltages of the Z(ener) diodes must be within the voltage range, outside which range it would come to damage or even destruction of the integrated circuit to be protected. Furthermore, the further diode should be low-ohmic in the preferred way, i.e. it should have a low resistance value so as to cope with the short-lasting current flow (referred to as ESD current flow) caused by the overvoltage.

Due to the arrangement of at least one further diode in series with the protection diode, the integrated circuit (for example, CMOS circuit) may surprisingly receive a higher input voltage, particularly a higher alternating voltage amplitude without causing any harm to the subsequent integrated circuit. This input voltage, particularly the alternating voltage amplitude may fall below the reference potential by the breakdown voltage of the further diode(s) or may exceed the power supply voltage by the breakdown voltage of the further diode(s) without the protection diodes becoming conducting and without an unwanted demodulation effect caused by the (protection) diodes occurring.

It is true that it is known from EP 0 360 933 A1 to arrange two breakdown diodes in series or to arrange a breakdown diode and a Z(ener) diode in series. However, the document EP 0 360 933 A1 does not deal with the problem of coping with external high-frequency disturbances after passage through the protective stage, which disturbances lead to increased voltage amplitudes at the input terminals and which, based on the increased control range for the input voltage according to the invention, entail demodulation effects affecting the signal path at corresponding, high interference amplitudes.

In accordance with the teaching of the present invention, the protection stage precedes at least one filter stage, particularly at least one high-frequency filter stage. Undemodulated high-frequency interference signals are expressly damped by this filter stage so that the integrated circuit is substantially not affected by these interference signals.

In this respect, those skilled in the art will appreciate that a subsequent arrangement of such a (high-frequency) filter stage behind a conventional input stage of the type described in the opening paragraph (cf., for example U.S. Pat. No. 4,254,442) cannot filter out such a frequently occurring, demodulated, low-frequency signal in this arrangement in so far as this demodulated signal is approximately in the (low-)frequency range of the useful signal. In contrast, the (high-frequency) filter stage arranged subsequent to the protection stage maintains its full effectivity on the basis of the literally "increased" ESD protection in accordance with the teaching of the present invention.

The invention also relates to an integrated circuit, more specifically a CMOS circuit, comprising at least a circuit arrangement of the type described hereinbefore.

These and other aspects of the invention are apparent from and will be elucidated with reference to the embodiments described hereinafter.

Figure 2:
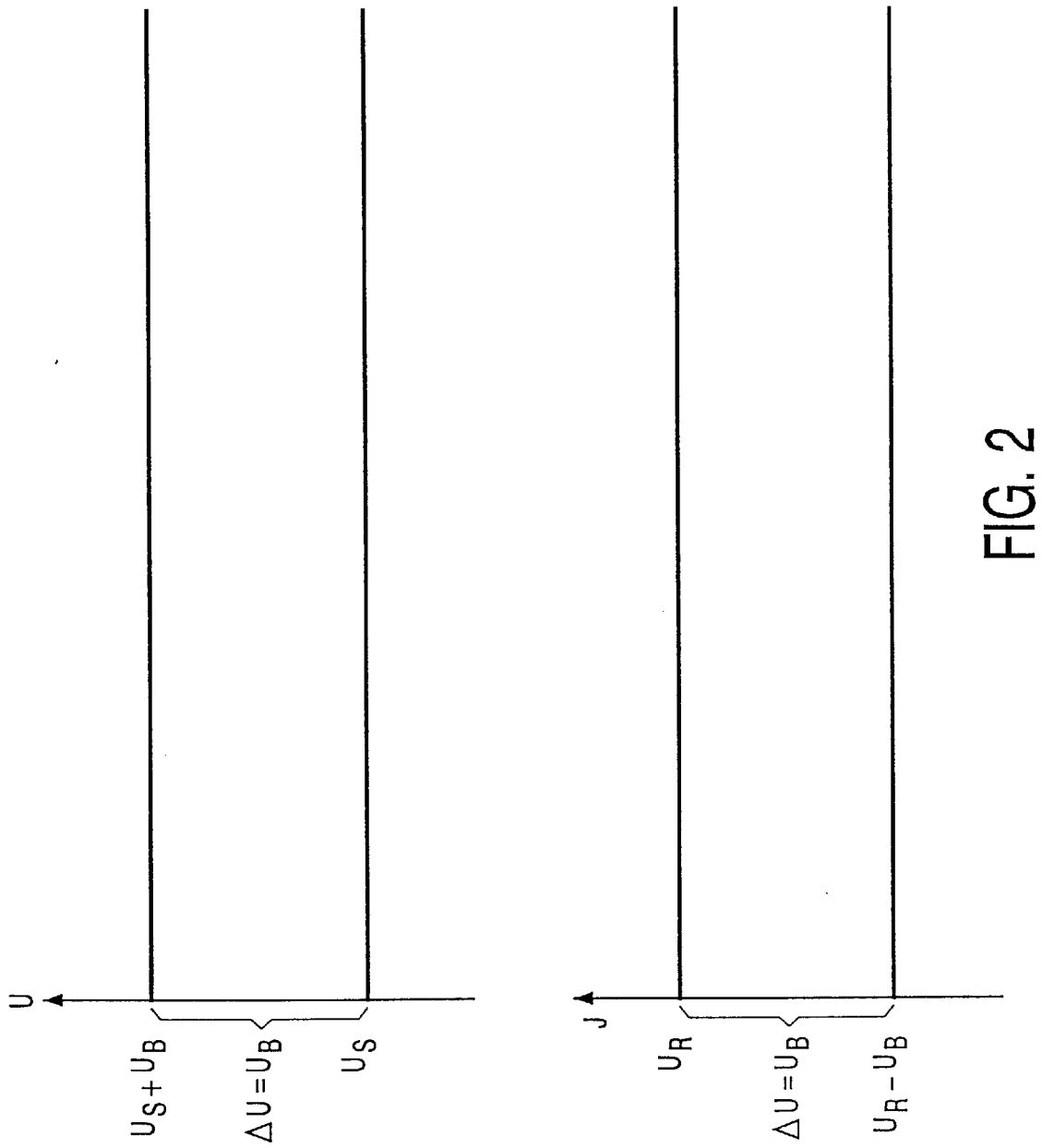

In the drawings:

FIG. 1 shows diagrammatically an embodiment of a circuit arrangement according to the present invention, FIG. 2 shows the control range for the input voltage in the circuit arrangement according to FIG. 1, as compared with a prior-art circuit arrangement.

The circuit arrangement 100 is provided for protecting the input, and here specifically the bond pad (=electrically conducting contact areas of an integrated circuit, particularly a chip) of an integrated CMOS circuit for analog signals (not shown for the sake of clarity in FIG. 1; compare the arrow in the right-hand part of FIG. 1) against overvoltages and has two input terminals 10, 20.

These input terminals 10, 20 are connected to a protection stage S; the input terminal 10 is connected by a semiconductor protection diode 12 to a power supply voltage $U_S$ (also compare FIG. 2) and by a semiconductor protection diode 16 to a reference potential $U_R$ corresponding to the earth potential (also compare FIG. 2). Further diodes 14, 18, namely Z(ener) diodes are arranged in series with the semiconductor protection diodes 12 and 16, respectively, (instead of the Z(ener) diodes 14 and 18, more than one further diode may be arranged in series with each protection diode 12 and 16).

Similarly, the input terminal 20 is connected by a semiconductor protection diode 22 to a power supply voltage $U_S$ and by a semiconductor protection diode 26 to a reference potential $U_R$ corresponding to the earth potential. Further diodes 24, 28, namely Z(ener) diodes are arranged in series with the semiconductor protection diodes 22 and 26, respectively (instead of the Z(ener) diodes 24 and 28, more than one further diode may be arranged in series with each protection diode 22 and 26).

As is shown in FIG. 2, the arrangement of the further diodes 14 and 18 and 24 and 28 ensures that the control range $U_R<U<U_S$ predetermined by the protection diodes 12 and 16 as well as 22 and 26 for the input voltage can be increased to a voltage range $U_R-U_B<U<U_S+U_B$ which is increased by the respective breakdown voltage $\Delta U_B$ of the Z(ener) diodes 14, 18 and 24, 28 and is thus larger than the voltage range $U_R<U<U_S$ between the reference potential $U_R$ and the power supply voltage $U_S$.

Due to the arrangement of the further diodes 14, 18 and 24, 28 in series with the protection diodes 12, 16 and 14, 18, a larger AC voltage amplitude may be applied to the integrated circuit (CMOS circuit) without causing harm to the subsequent integrated circuit. This AC voltage amplitude may fall below the reference potential $U_R$ by the breakdown voltage $\Delta U_B$ of the further diodes 18 and 28 or may exceed the power supply voltage $U_S$ by the breakdown voltage $\Delta U_B$ of the further diodes 14 and 24 without the protection diodes 12 and 16 as well as 14 and 18 becoming conducting and without an unwanted demodulation effect caused by the (protection) diodes occurring.

As is further shown in FIG. 1, the protection stage S precedes a high-frequency filter stage F in which each input terminal 10, 20 precedes a respective RC member 30, 32 (comprising a resistor 30 and a capacitor 32) and 40, 42 (comprising a resistor 40 and a capacitor 42), respectively. Undemodulated high-frequency interference signals are damped by this high-frequency filter stage so that the subsequent integrated circuit is substantially unaffected by these interference signals because the high-frequency filter stage F has its full effectivity due to the "increased" ESD protection (voltage range $U_R-U_B<U<U_S+U_B$ for the input signal).

A preamplifier unit 50 is arranged subsequent to the high-frequency filter stage F and precedes the integrated circuit to be protected.

The circuit arrangement shown in FIGS. 1 and 2 has a significantly improved electromagnetic compatibility as compared with conventional circuit arrangements (cf., for example U.S. Pat. No. 4,254,442), because the arrangement of the further diodes 14, 18 and 24, 28 in series with the protection diodes 12, 16 and 14, 18 ensures that external high-frequency interference signals are demodulated on the basis of the increased demodulation voltage at corresponding higher interference amplitudes, while the undemodulated high-frequency signals are successfully damped by the high-frequency filter stage F arranged subsequent to the protection stage S.

List of Reference Signs 100 circuit arrangement
10 (first) input terminal
12 (first) protection diode, connected to power supply voltage $U_S$
14 further diode, arranged in series with protection diode 12
16 (first) protection diode, connected to reference potential $U_R$
18 further diode, arranged in series with protection diode 16
20 (second) input terminal
22 (second) protection diode, connected to power supply voltage $U_S$
24 further diode, arranged in series with protection diode 22
26 (second) protection diode, connected to reference potential $U_R$
28 further diode, arranged in series with protection diode 26
30, 32 (first) RC member of the filter stage F, comprising
30 (first) resistor
32 (first) capacitor
40, 42 (second) RC member of the filter stage F, comprising
40 (second) resistor
42 (second) capacitor
50 preamplifier unit
F filter stage, particularly high-frequency filter stage
S protection stage
$U_B$ breakdown voltage of the further diodes 14, 18; 24, 28
$U_R$ reference potential
$U_S$ power supply voltage

What is claimed is:

1. A circuit arrangement for protecting the input of an integrated circuit particularly suitable for analog signals, more specifically a CMOS circuit, against overvoltages, said circuit arrangement (100) comprising:

at least two input terminals (10; 20) and at least one protection stage (S) in which each input terminal (10; 20) is connected to a power supply voltage ($U_S$) by a respective protection diode (12; 22), particularly a semiconductor diode, and to a reference potential ($U_R$) by a respective protection diode (16; 26), particularly a semiconductor diode, characterized in that at least a further diode (14, 18; 24; 28) is arranged in series with each protection diode (12, 16; 22, 26), and the protection stage (S) precedes at least a filter stage (F), particularly at least a high-frequency filter stage.

2. A circuit arrangement as claimed in claim 1, characterized in that the further diode (14, 18; 24, 28) is at least a Z(ener) diode and/or at least a preferably parasitic transistor diode with Z(ener) effect.

3. A circuit arrangement as claimed in claim 1, characterized in that more than one further diode (14, 18; 24, 28) is arranged in series with each protection diode (12, 16; 22, 26).

4. A circuit arrangement as claimed in claim 1, characterized in that the further diode (14, 18; 24, 28) has a breakdown voltage low enough such that a resulting clamped input voltage will not exceed a maximum voltage rating of the CMOS circuit.

5. A circuit arrangement as claimed in claim 1, characterized in that the further diode (14, 18; 24, 28) has a low resistance value.

6. A circuit arrangement as claimed in claim 1, characterized in that the filter stage (F) comprises at least two RC members (30, 32; 40, 42).

7. A circuit arrangement as claimed in claim 6, characterized in that each input terminal (10; 20) precedes a respective RC member (30, 32; 40, 42).

8. A circuit arrangement as claimed in claim 1, characterized in that the filter stage (F) precedes at least a preamplifier unit (50).

9. A circuit arrangement as claimed in claim 1, characterized in that the reference potential ($U_R$) is the earth potential or the ground potential.

10. An integrated circuit, more specifically a CMOS circuit, comprising at least a circuit arrangement (100) as claimed in claim 1.

* * * * *